May 6, 1969 SATOSHI YOSHIOKA ET AL 3,442,700

METHOD FOR THE DEPOSITION OF SILICA FILMS

Filed Dec. 23, 1966

United States Patent Office 3,442,700

Patented May 6, 1969

3,442,700

METHOD FOR THE DEPOSITION OF SILICA FILMS

Satoshi Yoshioka, Nishinomiya-shi, and Shigetoshi Takayanagi, Kyoto-shi, Japan, assignors to Matsushita Electronics Corporation, Osaka, Japan, a Corporation of Japan Filed Dec. 23, 1966, Ser. No. 604,277

Claims priority, application Japan, Dec. 27, 1965, 41/138

Int. Cl. C23c *13/04*

U.S. Cl. 117—201 4 Claims

ABSTRACT OF THE DISCLOSURE

Deposition of a silica film on the surface of semiconductor substrates.

Figure 1:
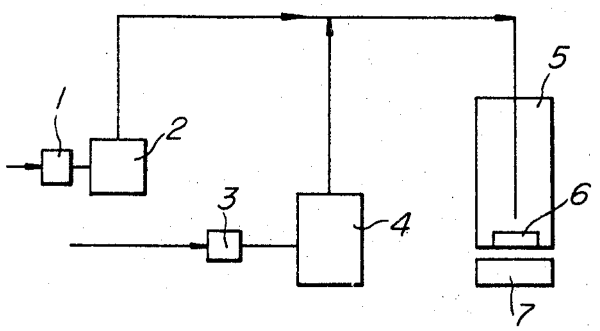

The film is dense and pure, and suitable for use as a passitivating film in the semiconductor devices such as transistors, diodes and integrated circuit.

Silicon fluoride (conc. 0.0005–0.1%) accompanied by a carrier gas and steam is passed on the surface of the semiconductor at a temperature above 650° C., said steam being 20–1000 times the silicon fluoride. Preferable carrier gas is nitrogen, argon, helium, neon, oxygen, carbon dioxide.

*Disclosure*

This invention relates to a method for the deposition of silica films. More particularly, it relates to a method for depositing a film of silica or silicon dioxide on the surface of semiconductor substrates in a semiconductor devices.

In the process of a semiconductor device fabrication, it has heretofore been necessary to form a dense film of silica on the surface of the semiconductor as a masking or passivating film. In the conventional semiconductor device consisting of silicon as an element, a silica film has usually been formed by the so-called thermal oxidation method, i.e., by heating the silicon slice at elevated temperatures of 1000° C. or higher in an atmosphere of oxygen or steam so as to oxidize the silicon surface. However, as a result of the recent developments of semiconductor devices having excellent function and complicated structure, it is a desideratum to provide a silica film having much the same quality, e.g., density or purity as that of the silicon thermal oxide film on the surface of such semiconductor substrates as silicon or others at a considerably low temperature, for example, 800° C. or lower. In case of depositing the silica film on the surface of such semiconductor materials as germanium, gallium arsenide, gallium phosphide, it is also necessary to deposit the film at the lower temperatures since these substances are readily decomposed at the higher temperatures.

It is also known to produce the silica film by means of hydrolysis of silicon tetrachloride or silicon tetrabromide, wherein a gaseous mixture of hydrogen and carbon dioxide to which silicon tetrachloride or silicon tetrabromide has been added is passed over the silicon or germanium substrate so that a thin silica film will be deposited on the surface thereof as a result of a reaction of the gaseous mixture at high temperatures. However, in order to obtain a silica film of high quality by this process, it is necessary to maintain the semiconductor substrate at high temperatures of 1150° C. or higher when the silicon tetrachloride gas is used and 800° C. or higher when the tetrabromide gas is used. It will thus give rise to the same difficulty as that encountered in the aforesaid thermal oxidation process.

Alternatively, a process using the so-called disproportionation reaction is also known. In this process, a silicon slice is placed in a quartz tube at one end thereof and a certain amount of concentrated hydrofluoric acid is also charged in said tube before sealing. By keeping the end of said tube in which the silicon slice has been placed at a low temperature and the other end thereof at a high temperature, the reversible reaction proceeds to the left and to the right respectively as follows:

$$SiO_2+4HF \rightleftarrows SiF_4+2H_2O \quad (1)$$

A silica film is thus deposited on the silicon slice. However, this process is not always suitable for the commercial production of the semiconductor device since not only the process itself but also the product obtained thereby have some fatal defects as indicated below.

The first defect is that the deposition of the silica film is comparatively slow, since the deposition rate depends upon a reaction rate between the surface of the quartz tube and the hydrogen fluoride and also a diffusion of the gaseous silicon tetrafluoride and hydrogen fluoride. The rate of formation of silica film at a certain reaction temperature depends upon the amount of hydrofluoric acid sealed, i.e., the pressure of silicon tetrafluoride, hydrogen fluoride and steam existing in the quartz tube as the silica film is formed. Thus the higher the pressure is, the greater the rate becomes.

However, as the pressure inside the tube increases, such a subreaction as shown below occurs vigorously.

$$2SiF_4+H_2O=(SiF_3)_2O+2HF \quad (2)$$

As a result, the amount of silicon oxyfluoride in the silicon dioxide also increases, which will deteriorate the density and the purity of the silica film and thus considerably degrade the characteristics of the semiconductor device utilizing the silica film thus produced. Moreover, in view of the limited mechanical strength of quartz, the increase in the deposition rate of silica films is subjected to an unavoidable restriction.

The second defect is that it is necessary in the formation of silica films to preliminarily cool one end of the quartz tube containing a hydrofluoric acid and a silicon slice on which the silica film is to be deposited so as to solidify the hydrofluoric acid while evacuate the inside of the tube by means of a vacuum pump and fuse to seal the other end thereof. Furthermore, the quartz tube must be mechanically destroyed after formation of the silica film in order to remove the slice therefrom. The operation of this process will thus become complicated which incurs extremely high cost in the production of silica films.

The third defect is that a certain objectionable silicon compound called "stain film" is formed on the surface of silicon due to a chemical reaction between silicon and hydrofluoric acid at a temperature not higher than that at which a reaction for producing silica films occurs. The stain film will form a complex film with the silica film resulting from the disproportionation reaction; the complex film is undesirable for the manufacture of semiconductor device with respect to insulation and uniformity.

It is an object of the present invention to form dense and pure silicon dioxide films on the substrates of the semiconductor device at a low temperature not harmful to the complicated and delicate structure thereof.

It is another object of the present invention to form such films as rapidly as possible.

It is still another object of the present invention to provide a process capable of producing silica films in a commercial manner and at a cheap cost.

These and other objects and advantages of the present invention will become apparent to those skilled in the art from a consideration of the following specification and claims.

*Summary of the invention*

After studies of the process for producing silica films by the reaction of silicon tetrafluoride and steam in a "flowing system" method, the inventors have found that a dense and pure silica film just like the thermal oxide film of silicon can be produced at a high rate suitable for commercial process without any difficulty encountered in the conventional "closed system" methods by providing a gaseous mixture of silicon tetrafluoride with steam and a carrier gas in which a concentration of silicon tetrafluoride is 0.0005 to 0.1% and a concentration ratio of the steam to the silicon tetrafluoride is 20 to 1000 and allowing said gaseous mixture to flow over the surface of semiconductor substrates maintained at a temperature of 650° C. or higher. In this case, nitrogen, argon, helium, neon, oxygen, carbon dioxide or hydrogen may be used as the carrier gas.

The preferable embodiments of the invention are further described with reference to the drawing.

*Brief describtion of the drawing*

Figure 2:
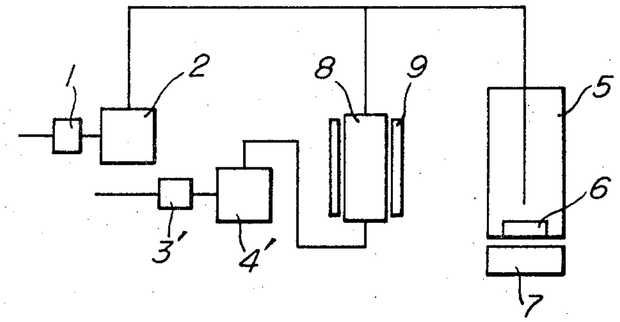

FIG. 1 and FIG. 2 are schematic views of preferable embodiments of the units adapted for use in practising the present invention.

*Description of the preferred embodiments*

In FIG. 1, a carrier gas such as nitrogen, argon, helium, neon, oxygen or carbon dioxide passing through the respective flow meters 1 and 3 is supplied to a steam evaporator 2 and a silicon tetrafluoride evaporator 4, respectively. These two evaporators are made of quartz glass and kept at the respective predetermined temperatures. The carrier gas streams from the evaporators containing the respective saturated vapors are caused to mix with each other to produce a reaction gas. It is then allowed to react upon a thin slice 6 of semiconductor heated to a predetermined temperature in a reaction chamber made of quartz so that a silica film is formed on the surface of the slice 6. In FIG. 2, the silicon tetrafluoride is formed by passing a carrier gas through a flow meter 3' and a hydrogen fluoride evaporator 4' made of polyethylene and then a quartz fragment bed 8 heated to 100 to 200° C. by means of an electric furnace 9. The silicon tetrafluoride is then mixed with a carrier gas containing water vapor, and the resulting gas is allowed to react on the semiconductor slice. It will also produce the silica film similar to that obtained in FIG. 1.

By these processes, a dense and pure silica film may be formed not only on the surface of semiconductor but also on any other surface of solid which is stable at the reaction temperature of 650° C. or higher.

As a result of repeated investigations on the chemical kinetics of the reaction for producing silica films from silicon tetrafluoride and steam using the flowing method, particularly on the relations between the reaction temperature or gaseous composition and the properties of the silica films produced, the inventors have discovered the fact as follows.

The rate of deposition of the silica film increases with the increasing concentration of silicon tetrafluoride and with the increasing ratio of the concentration of water vapor to that of silicon tetrafluoride in the reaction gas. In order to obtain a rate of the deposition suitable for the commercial process, it is necessary to select a reaction temperature of 650° C. or higher, a concentration of silicon tetrafluoride in the reactive gaseous mixture of 0.0005 to 0.1% and a ratio of the concentration of water vapor to that of silicon tetrafluoride in said mixture of 20 to 1000, respectively. The reaction temperature, the concentration of silicon tetrafluoride and the ratio of the concentration of water vapor to that of silicon tetrafluoride should preferably be 700 to 1000° C., 0.005 to 0.03% and 100 to 400, respectively, which will provide the optimum conditions for producing a dense silica film suitable for use as a passivating film in the semiconductor device. In case that the concentration of silicon tetrafluoride in the reactive gaseous mixture exceeds over 0.1 or the ratio of the concentration of water vapor to that of silicon tetrafluoride is less than 20 which is ten times the stoichiometric ratio, the side reaction represented by the Equation 2 will vigorously occur to such an extent that the density and the purity of the deposited film will become so poor that it may not be used as a passivating film in the semiconductor device. On the other hand, if the concentration of silicon tetrafluoride in the gaseous mixture is less than 0.0005% or the ratio of the concentration of water vapor to that of silicon tetrafluoride in said mixture is more than 1000, the rate of deposition of silica films will become low, which will not be suitable for a commercially useful process.

In case of passing hydrogen fluoride through quartz fragments bed to produce silicon tetrafluoride and thereafter obtain the silica film, one mol of silicon tetrafluoride can be obtained from 4 mols of hydrogen fluoride. Thus it has been found that when the hydrogen fluoride corresponding to 0.002 to 0.4% of the gaseous mixture is passed at the reaction temperature of 650° C. or higher with the ratio of the concentration of water vapor to that of the hydrogen fluoride in the gaseous mixture of 5 to 250 the silica film may be obtained in the same manner as in the case of using silicon tetraflouride, and that the optimum conditions for producing silica films on a commercial basis are the use of the reaction temperature of 700° C. to 1000° C., the amount of hydrogen fluoride of 0.02 to 0.12% of the gaseous mixture and the ratio of the concentration of water vapor to that of the hydrogen fluoride of 25 to 100.

*Examples of the invention*

The following examples are given merely as illustrative of the present invention and are not to be considered as limiting.

*Example 1.*—A thin silicon disk having polished surfaces of 23 mm. dia. and 0.2 mm. thickness was placed on the bottom of a quartz reactor having a sealed bottom end of 48 mm. dia. and 400 mm. of height. The reactor was externally heated to 700° C. by the use of an infrared heater of 1 kilowatt, while a carrier gas nitrogen was passed respectively to a steam evaporator kept at a temperature of 30° C. and to a silicon tetrafluoride evaporator kept at a temperature of −135° C. at the flow rates of 90 cc./min. and 10 cc./min. to produce water vapor and hydrogen fluoride. They were then mixed to obtain a mixture having 0.06% silicon tetrafluoride and a ratio of concentration of water vapor thereto of 64. It was passed through a quartz tube of 10 mm. dia. over the heated silicon slice for one hour. A silica film having a thickness of about 3000 A. was thus deposited. It showed index of refraction of 1.451, density of 2.23 g./cm.$^3$, etch rate of 5.0 A./sec. in a hydrofluoric acid of 1.8 mol concentration and breakdown voltage of $3\times10^6$ v./cm., and had the same density and purity as that of thermal oxide film of silicon.

*Example 2.*—Nitrogen was passed to a hydrogen fluoride evaporator maintained at −75° C. at a rate of 20 cc./min. so as to allow the reactive gaseous mixture to contain an amount of hydrogen fluoride corresponding to 0.12% of said mixture. The quartz glass fragments were filled in a Teflon tube having 20 mm. dia. and 400 mm. height; the tube was externally heated at 150° C. by an electric furnace. The said nitrogen mixture was passed through the tube. The silicon tetrafluoride-containing gas thus obtained was mixed with another nitrogen gas which had been passed at a rate of 80 cc./min. through a water vapor evaporator kept at 40° C. and thus contained a saturated water vapor therein. The resulting reactive gaseous mixture having 0.03% silicon tetrafluoride and a concentration ratio of water vapor thereto of 190 was allowed to react on the said silicon slice heated at 700° C. for two hours to produce a silica film having thickness of about 5000 A. The film showed index of refraction of 1.453, density of 2.23 g./cm.$^3$, etch rate of 3 A./sec. in a hydrofluoric acid of 1.8 mol concentration and breakdown voltage of $5 \times 10^6$ v./cm. The reactive gaseous mixture of the same composition was also caused to react on a silicon slice heated at 650° C. for three hours to a silica film of 2000 A. thickness. The film had substantially the same characteristics as those given in the case of using the reaction temperature of 700° C.

*Example 3.*—A gaseous mixture was prepared which contained 0.001% silicon tetrafluoride and a concentration ratio of water vapor thereto of 100. The silicon tetrafluoride was obtained in the same manner as in Example 2. The gaseous mixture was caused to react on a germanium slice heated at 700° C. for four hours to give a silica film having a thickness of 3000 A. In this case the rate of deposition of the film was too slow to be adapted for use in a commercial production. However, the film had substantially the same characteristics, i.e., index of refraction, density, etch rate in a hydrofluoric acid of 1.8 mol concentration and breakdown voltage, as those given in Example 2.

Attempts were made to replace the silicon or the germanium of Examples 1 to 3 by gallium arsenide, gallium phosphide or other semiconductors, aluminium oxide, magnesium oxide or other oxide crystals which are difficult to fuse, molybenum or other metals. The results showed that in any case an excellent silica film was obtained as in the aforesaid examples.

We claim:

1. A method for the deposition of silica films which comprises providing a gaseous mixture of silicon tetrafluoride with steam and a carrier gas, said mixture having a concentration of silicon tetrafluoride of 0.0005 to 0.1% and a concentration ratio of the steam thereto of 20 to 1000, and allowing said mixture to flow over the surface of semiconductor substrate maintained at a temperature of 650° C. or higher.

2. A method for the deposition of silica films which comprises providing a gaseous mixture of silicon tetrafluoride with steam and a carrier gas, said mixture having a concentration of silicon tetrafluoride of 0.005 to 0.3% and a concentration ratio of the steam thereto of 100 to 400, and allowing said mixture to flow over the surface of semiconductor substrate maintained at a temperature between 700 to 1000°C.

3. A method according to claim 1 in which the carrier gas is at least one member selected from the group consisting of nitrogen, argon, helium, neon, oxygen, carbon dioxide and hydrogen.

4. A method according to claim 2 in which the carrier gas is at least one member selected from the group consisting of nitrogen, argon, helium, neon, oxygen, carbon dioxide and hydrogen.

References Cited

UNITED STATES PATENTS

| | | | |
|---|---|---|---|
| 2,535,036 | 12/1950 | Broughton. | |
| 2,967,115 | 1/1961 | Herrick. | |
| 3,203,759 | 8/1965 | Flemmert. | |
| 3,273,963 | 9/1966 | Gunn. | |
| 3,287,162 | 11/1966 | Chu et al. | 117—106 |

ALFRED L. LEAVITT, *Primary Examiner.*

A. GOLIAN, *Assistant Examiner.*

U.S. Cl. X.R.

117—106